United States Patent
Behkami et al.

(10) Patent No.: US 6,775,630 B2
(45) Date of Patent: Aug. 10, 2004

(54) WEB-BASED INTERFACE WITH DEFECT DATABASE TO VIEW AND UPDATE FAILURE EVENTS

(75) Inventors: Nima A. Behkami, Portland, OR (US); James W. Seale, Colorado Springs, CO (US); Newell E. Chiesl, Colorado Springs, CO (US); Mark A. Giewont, Gresham, OR (US); Robert B. Powell, Colorado Springs, CO (US)

(73) Assignee: LSI Logic Corporation, Milpitas, CA (US)

(*) Notice: Subject to any disclaimer, the term of this patent is extended or adjusted under 35 U.S.C. 154(b) by 0 days.

(21) Appl. No.: 10/128,534

(22) Filed: Apr. 23, 2002

(65) Prior Publication Data

US 2002/0196969 A1 Dec. 26, 2002

(Under 37 CFR 1.47)

Related U.S. Application Data

(60) Provisional application No. 60/292,832, filed on May 21, 2001.

(51) Int. Cl.[7] .................... G06F 19/00; G06F 15/16
(52) U.S. Cl. .................... 702/81; 702/84; 702/182; 709/201; 709/203; 700/109; 700/121
(58) Field of Search .................... 702/81, 84, 182, 702/185, 188, 34–35; 700/109–110, 117, 121; 707/201, 202, 203

(56) References Cited

U.S. PATENT DOCUMENTS

| | | | | |
|---|---|---|---|---|
| 5,777,901 A | * | 7/1998 | Berezin et al. | 716/19 |
| 6,148,307 A | * | 11/2000 | Burdick et al. | 707/104.1 |
| 6,292,582 B1 | * | 9/2001 | Lin et al. | 382/149 |
| 6,332,110 B1 | * | 12/2001 | Wolfe | 702/22 |

* cited by examiner

*Primary Examiner*—Bryan Bui
(74) *Attorney, Agent, or Firm*—Suiter West PC LLO

(57) ABSTRACT

The present invention is directed to a system and method for providing access to semiconductor manufacturing information. The present invention system and method allows users to interface with semiconductor characteristic data and to data associated with manufacturing conditions over a network. The system includes at least one input device for entering manufacturing data. A data storage device capable of storing the database of manufacturing data, including semiconductor characteristic data and manufacturing conditions is networked to the at least one input device. A plurality of remote devices suitable for interfacing with the data are networked to the storage device, such that the manufacturing data is provided to a website for access upon occurrence of failure event.

9 Claims, 4 Drawing Sheets

WEB-BASED INTERFACE WITH DEFECT DATABASE TO VIEW AND UPDATE FAILURE EVENTS

CROSS REFERENCE

The present application claims priority to U.S. Provisional Patent Application No. 60/292,832, entitled: Web-Bases Interface With Defect Database To View and Update Events, filed on May 21, 2001, which is hereby incorporated in its entirety.

FIELD OF THE INVENTION

The present invention generally relates to the field of semiconductor manufacture, and particularly to a system and method for accessing semiconductor manufacturing data.

BACKGROUND OF THE INVENTION

Semiconductor manufacturing is costly due to the expense of production materials and costs associated with maintaining a clean environment during manufacture. Defects within the semiconductor wafer are of particular importance. A defect which makes the semiconductor unusable results in a loss in production capability with a resultant increase in cost for the manufacturer and for the consumer.

In order to minimize wafer defects, and thus increase cost efficiency manufactures establish strict quality control guidelines. Quality control guidelines insure minimization of device failure due to wafer defects. A difficulty associated with semiconductor wafer production is determining the root cause of the problem affecting semiconductor performance. Establishing the cause of poor performance or perhaps failure of a semiconductor is problematic because the wafers undergo numerous processes which may cause the problem or failure.

Semiconductor manufacturing is further problematic because of the large number of engineer, technicians, and support personnel which are necessary to implement production. Personnel formed into groups are charged with detecting problems and ultimately resolving the difficulty while minimizing production delays and the number of defective chips. In order to increase productivity, employees must be able to recognize the problem and have sufficient information to rectify the situation.

Drawbacks to previous data management systems for semiconductor manufacturing include the failure to track data sufficiently, the inability to provide notification and difficulty in accessing data. Current semiconductor manufacturing data management systems often provide insufficient detail about manufacturing. For example, some data management systems solely provide wafer information. Wafer information fails to provide comprehensive information necessary for managing overall production. Further, the inability of current semiconductor manufacturing data management systems to notify personnel of problems including semiconductor failure may result in higher numbers of defective semiconductors and increased costs. Semiconductor manufacturing data management systems fail to provide an efficient interface with manufacturing data necessary to address problems. Drawbacks to current semiconductor manufacturing data management system make such systems impractical, leading to increased down-time and higher semiconductor failure rates.

Therefore, it would be desirable to provide an efficient semiconductor manufacturing data management system capable of tracking semiconductor characteristics manufacturing conditions while maintaining ease of interaction.

SUMMARY OF THE INVENTION

Accordingly, the present invention is directed to a system and method for providing efficient, comprehensive access to semiconductor manufacturing information. A comprehensive system for accessing semiconductor data and in particular wafer characteristics and manufacturing condition allows users responsible for various phases of semiconductor production to analyze defects; thus reducing overall number of non-conforming semiconductors and lower costs.

In a first aspect of the present invention a system for monitoring semiconductor defects includes at least one input device capable of determining semiconductor manufacturing data. Manufacturing data includes at least one semiconductor characteristic and at least one manufacturing condition. A network connects a data storage device to the input device and a plurality of remote devices.

In a second aspect of the present invention a management system for semiconductor manufacturing data includes a memory capable of storing a program of instructions. A processor capable of performing a program of instructions is communicatively coupled to the memory and a storage device capable of storing a database of manufacturing data. The program of instructions configures the processor to generate a map interface, a tool interface, an edit interface and a lot disposition tool suitable for correlating manufacturing data including semiconductor characteristics and manufacturing conditions in the event of a failure determination. The processor is capable of generating an electronic notification to a remote device over a network.

A method for tracking semiconductor manufacturing defects initially includes determining semiconductor defect during manufacturing. At least one manufacturing condition associated with the semiconductor defect is determined. A database of manufacturing data including semiconductor defects and at least one manufacturing condition in the event of semiconductor failure is accessed. Accessed manufacturing data is correlated to the semiconductor failure. Manufacturing data is provided over a network to a website. Additionally, a electronic notification may be sent to a remote user.

It is to be understood that both the forgoing general description and the following detailed description are exemplary and explanatory only and are not restrictive of the invention as claimed. The accompanying drawings, which are incorporated in and constitute a part of the specification, illustrate an embodiment of the invention and together with the general description, serve to explain the principles of the invention.

BRIEF DESCRIPTION OF THE DRAWINGS

The numerous advantages of the present invention may be better understood by those skilled in the art by reference to the accompanying figures in which.

DETAILED DESCRIPTION OF THE INVENTION

Reference will now be made in detail to the presently preferred embodiments of the invention, examples of which are illustrated in the accompanying drawings. Referring generally to FIGS. 1 through 4, exemplary embodiments of the present invention are shown wherein a system and method tracks semiconductor defects. The system and method of the present invention provide comprehensive data management capable of reducing the number of non-conforming semiconductors and improving overall manufacturing efficiency.

Figure 1:
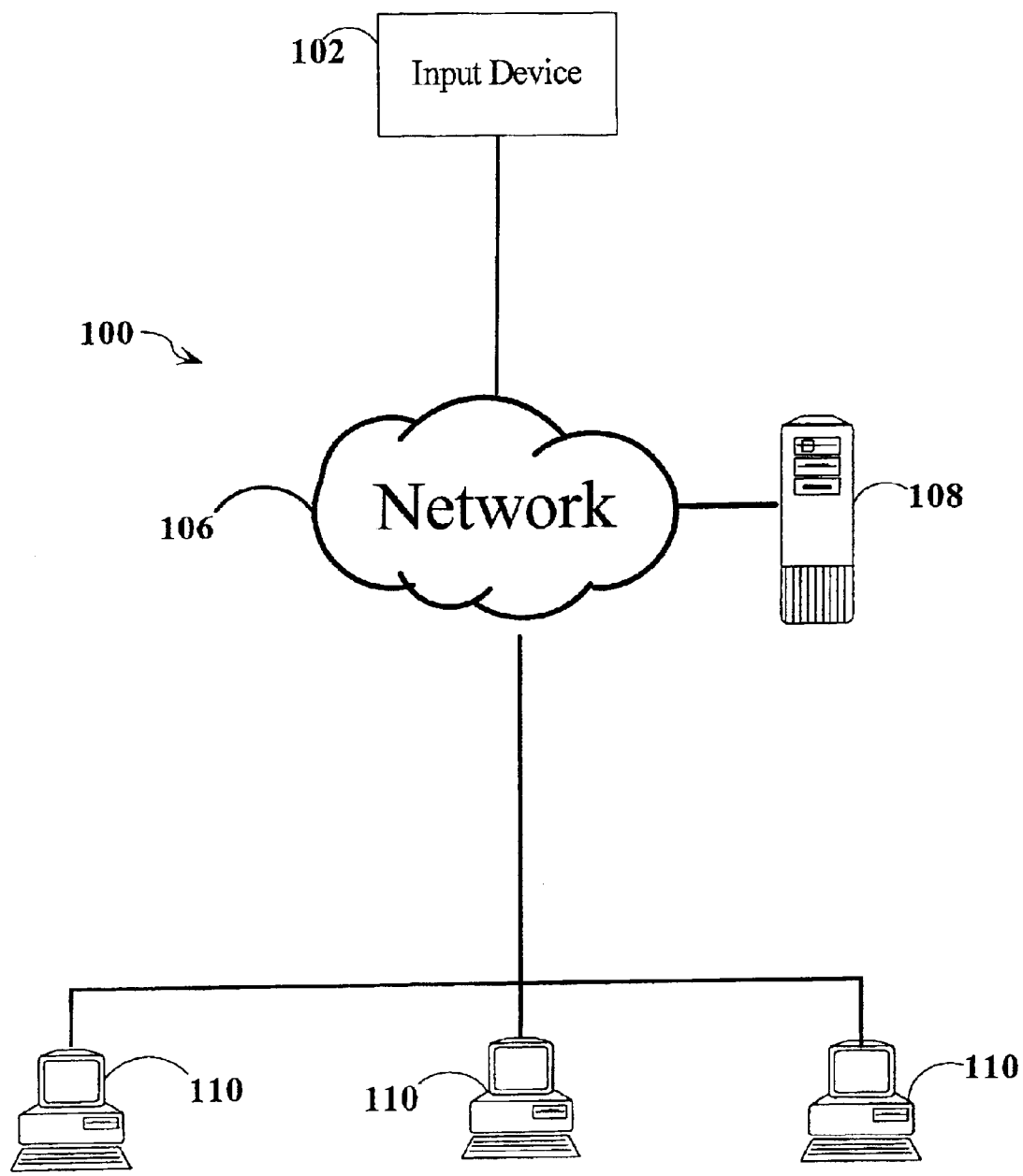
FIG. 1 is an illustration of an exemplary embodiment wherein a system for monitoring semiconductor manufacturing data is shown.

Referring to FIG. 1, an exemplary embodiment of the present invention is shown. In a first aspect of the present invention, a system for monitoring semiconductor manufacturing defects 100 includes at lest one input device 102. An input device 102 is capable of determining manufacturing data which includes at least one of a semiconductor characteristic and a manufacturing condition. For example, a scanning electron microscope (SEM) may be utilized to observe and record defects such as a particulate defect. Wafer characteristics include wafers effected, wafer maps, Paredo charts, defect size, defect location, defect category, time, lot identification, layer step identification, scan date, failure, comments and the like. Manufacturing conditions include at least one of equipment history, yield impact, die impact, suspected equipment, category, contact person, contact group, evaluator, disposition, reassignment, time and the like. While it may be desirable for automatic up-dates, it is desirable in some instances to allow users to input data, such as observations.

A network 106 connects the input device 102 to a data storage device 108. Suitable networks include a local area network (LAN), a wide area network (WAN), an intranet, an internet, and the Internet. The network 106 connects the inspection device and the detection device 104. The data storage device 108 is suitable for storing manufacturing data including wafer characteristics and manufacturing conditions. In implementations of the present invention the data may be stored on a dedicated server and transmitted over the network such as the Internet to a website to allow for efficient access to the manufacturing data. In further embodiments of the present invention, correlated data such as trend information, kill ratio, the ratio of the effectiveness of defect to reduce yield; yield loss/impact are calculated and stored in the database.

A plurality of remote devices 110 are connected to the network. Remote devices are suitable for interfacing with the manufacturing data in the data storage device 108. In additional embodiments, remote devices are capable of accessing data via a website. Remote devices include information handling systems, wireless communication devices, input/output devices and the like. In embodiments, a remote device is capable of receiving an electronic notification in the event of failure, such as a failure correlated to a specific personnel group's responsibility. Electronic notification includes electronic mail, instant messaging, a page, text messaging and a screen pop-up.

Figure 2:
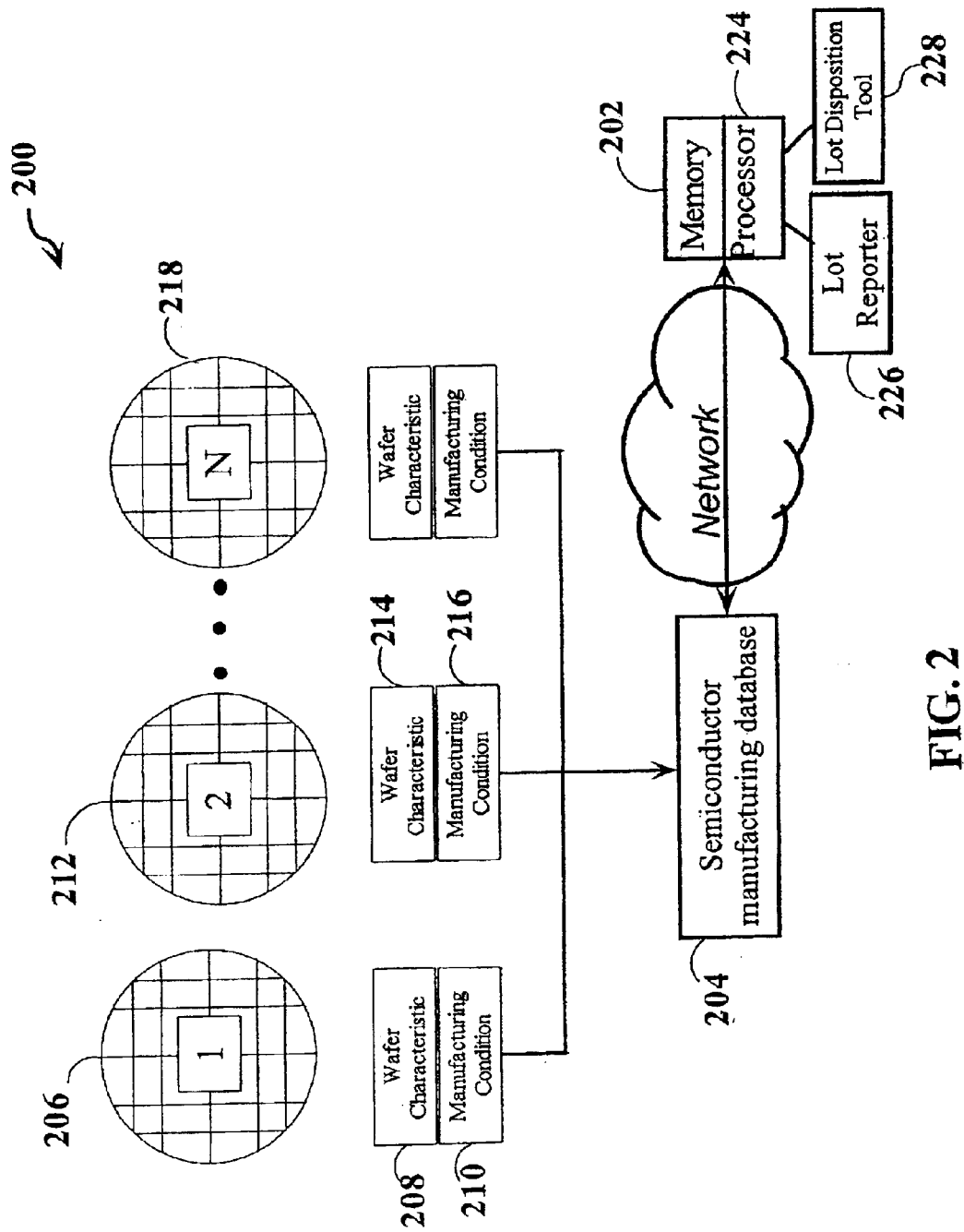
FIG. 2 is an illustration of an exemplary embodiment wherein a management system for semiconductor manufacturing data is shown.

Referring now to FIG. 2 an exemplary embodiment 200 of the present invention is shown. In the present aspect of invention, a management system for semiconductor manufacturing data includes a memory 202. The memory 202 is suitable for storing a program of instructions.

A data storage device 204 is included in the management system for semiconductor manufacturing data. The data storage device 204 is capable of storing semiconductor manufacturing data. Manufacturing data includes wafer characteristics as well as manufacturing conditions.

For example, a first semiconductor wafer 206, from a first lot of wafers may have a wafer characteristic such as a scratch defect. The scratch is entered either automatically from an automatic input device, or entered manually by an engineer into wafer characteristic data 206. Wafer characteristics include wafers effected, wafer maps, Paredo charts, defect size, defect location, defect category, time, lot identification, layer step identification, scan date, failure, comments and the like.

Manufacturing data for the first wafer 206 may include associated manufacturing conditions 210 such as equipment history. For example manufacturing conditions such as equipment history, yield impact, die impact, suspected equipment, category, contact person, contact group, evaluator, disposition, reassignment, time and the like. Manufacturing conditions are input either automatically or are entered by personnel such as a technician.

Substantially similar wafer characteristic data and manufacturing data are obtained for a second wafer 212 through wafer N 218. While in the present aspect manufacturing data including wafer characteristics and manufacturing conditions are compiled for individual wafers should be apparent that groups of wafers are capable of substantially similar data determination.

A processor 224 is communicatively coupled to the memory device 202 and the data storage device 204. Suitable communicative couplings include a local area network (LAN), a wide area network (WAN), an intranet, an internet, the Internet, as well as wired connections or optical communication systems. In further embodiments manufacturing data is provided via a website for remote access. While specific arrangements are discussed other arrangements are contemplated within the scope and spirit of the present invention. The processor 224 may access manufacturing data from data storage device 204 and is suitable for performing a program of instructions to generate a lot reporter interface 226 and a lot disposition tool 228.

Figure 3:
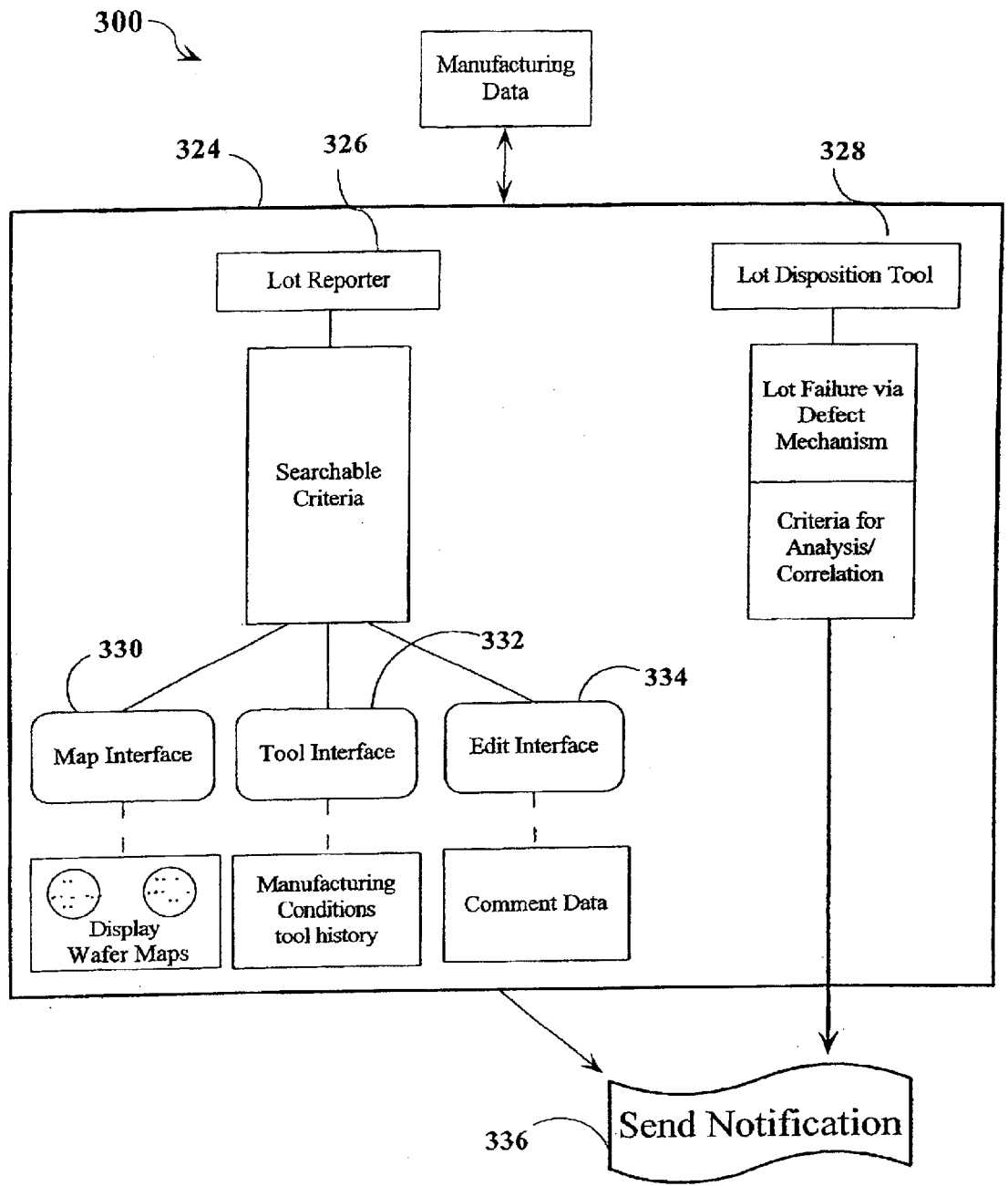
FIG. 3 is an illustration of an exemplary embodiment wherein a processor is capable of generating a lot reporter interface and a lot disposition tool.

Referring now to FIG. 3, an exemplary embodiment of a processor 324 generating a lot reporter interface 326 and a lot disposition tool 328 is discussed. The lot reporter interface 326 includes a map interface 330, a tool interface 332 and an edit interface 334. The processor 324 accesses manufacturing data such as the manufacturing database of data storage device 204 as discussed with respect to FIG. 2. The map interface 330 allows a user to access wafer characteristic data and in particular wafer map of various defects. The tool interface allows a user to access manufacturing condition data. The edit interface 334 permits users to enter comments associated with the particular lot, piece of equipment and the like. In embodiments of the present invention correlated data such as trend maps, kill ratios and the like are available utilizing the lot reporter interface 326.

The lot disposition tool 328, generated by the processor 324, correlates manufacturing data. For example, in an event of failure, a user may access the lot disposition tool to search data corresponding to a particular set or lot of wafers, view trends, access failure mechanism data or observe relevant data. Further, the user may input data such as comments, update manufacturing data such as updating a miss-categorized defect and the like.

In aspects of the present invention, the processor 324 generates an electronic notification 336 upon disposition of a failure event, automatically based on input and the like. Electronic notifications include electronic mail, instant messaging and pop-up windows. Electronic notifications 336 may be communicated over a network such a local area network (LAN), a wide area network (WAN), an intranet, an internet, the Internet, as well as wired connections or optical communication systems associated with the management system for semiconductor data.

Figure 4:
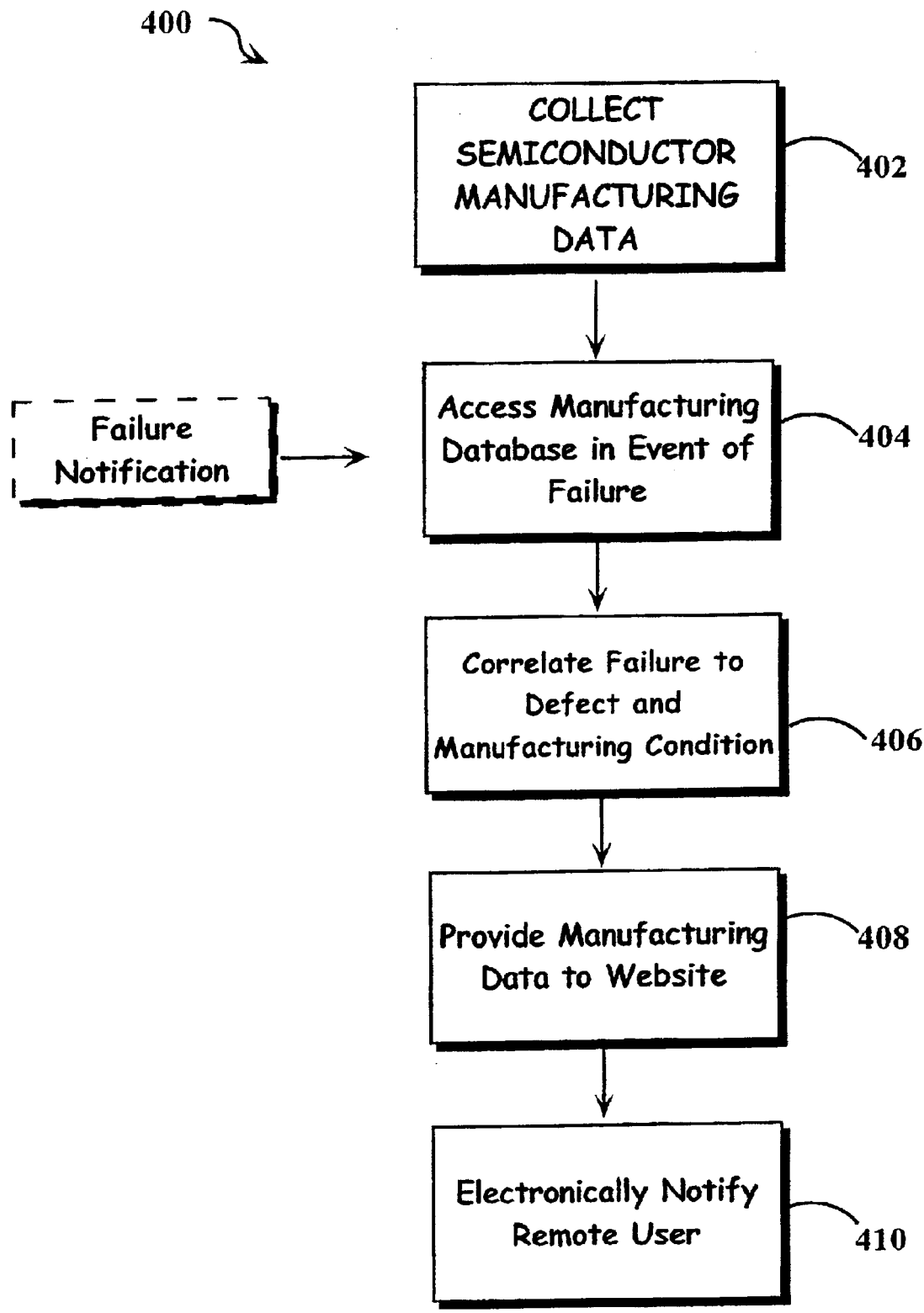
FIG. 4 a flow diagram of a method of the present invention wherein semiconductor manufacturing data is provided via a website.

Referring now to FIG. 4, a method for tracking semiconductor manufacturing defects 400 is described. Initially, manufacturing data, including at least one semiconductor characteristic and at least one manufacturing condition, is collected 402 in a database of semiconductor manufacturing data as generally described in FIGS. 1 through 3.

The database of collected manufacturing data is accessed upon the occurrence of a failure event 404, such as when a semiconductor device is tested and found defective or when a semiconductor fails to meet a particular quality control guideline. Accessed manufacturing data from the database is correlated to the failure event 406.

For example, correlating data includes utilizing a lot disposition tool as described in FIGS. 2 and 3 implemented to allow viewing data as well as correlating data to the failure. In another example, a kill ratio for a semiconductor defect is correlated. In further embodiments, correlating data may occur automatically, such as on disposition of a particular lot of semiconductors, after a specific time period or the like.

Manufacturing data from the database including correlated data is provided to a website. Providing data to a website 410 utilizes a network connection such as one of a local area network (LAN), a wide area network (WAN), an intranet, an internet and the Internet.

In additional embodiments the present method further includes electronically notifying a user 410. For example electronically notifying a user includes sending an employee or group of employees responsible for the particular aspect of production an email, instant messaging, an interface pop-up window and the like.

In exemplary embodiments, the methods disclosed may be implemented as sets of instructions or software readable by a device. Further, it is understood that the specific order or hierarchy of steps in the methods disclosed are examples of exemplary approaches. Based upon design preferences, it is understood that the specific order or hierarchy of steps in the method can be rearranged while remaining within the scope of the present invention. The accompanying method claims present elements of the various steps in a sample order, and are not meant to be limited to the specific order or hierarchy presented.

Although the invention has been described with a certain degree of particularity, it should be recognized that elements thereof may be altered by persons skilled in the art without departing from the spirit and scope of the invention. One of the embodiments of the invention can be implemented as sets of instructions resident in the memory of one or more information handling systems, which may include memory for storing a program of instructions and a processor for performing the program of instruction, wherein the program of instructions configures the processor and information handling system. Until required by the information handling system, the set of instructions may be stored in another readable memory device, for example in a hard disk drive or in a removable medium such as an optical disc for utilization in a CD-ROM drive and/or digital video disc (DVD) drive, a compact disc such as a compact disc-rewriteable (CD-RW), compact disc-recordable and erasable; a floppy disk for utilization in a floppy disk drive; a floppy/optical disc for utilization in a floppy/optical drive; a memory card such as a memory stick, personal computer memory card for utilization in a personal computer card slot, and the like. Further, the set of instructions can be stored in the memory of an information handling system and transmitted over a local area network or a wide area network, such as the Internet, when desired by the user.

Additionally, the instructions may be transmitted over a network in the form of an applet that is interpreted or compiled after transmission to the computer system rather than prior to transmission. One skilled in the art would appreciate that the physical storage of the sets of instructions or applets physically changes the medium upon which it is stored electrically, magnetically, chemically, physically, optically or holographically so that the medium carries computer readable information.

It is believed that the web-based interface with defect database to view and update failure events of the present invention and many of its attendant advantages will be understood by the forgoing description. It is also believed that it will be apparent that various changes may be made in the form, construction and arrangement of the components thereof without departing from the scope and spirit of the invention or without sacrificing all of its material advantages. The form herein before described being merely an explanatory embodiment thereof. It is the intention of the following claims to encompass and include such changes.

What is claimed is:

1. A management system for semiconductor manufacturing data, comprising:
    a memory suitable for storing a program of instructions;
    a data storage device capable of storing a database of manufacturing data including at least one manufacturing condition and at least one wafer characteristic;
    a processor suitable for performing a program of instructions, communicatively coupled to the memory and the data storage device, wherein the program of instruction configures the processor to generate
        a lot reporter interface, suitable for tracking manufacturing data, the lot reporter includes
            a map interface capable of displaying a wafer defect map;
            a tool interface suitable for providing manufacturing conditions;
            an edit interface capable of recording comments; and
        a lot disposition tool capable of correlating manufacturing data in the event of failure;
    wherein the processor is capable of generating a electronic notification to a remote device over a network.

2. A management system for semiconductor manufacturing data of claim 1, wherein manufacturing data includes at least one of equipment history, die impact, suspected equipment, category, contact person, contact group, disposition, reassignment, evaluator, time, wafers effected, wafer map including defect size, defect location, defect type, lot identification, layer step identification, scan date, failure and comments.

3. A management system for semiconductor manufacturing defect data of claim 1, wherein a semiconductor characteristic is at least one of wafers effected, wafer map, defect size, defect location, defect type, time, lot identification, layer step identification, scan date, failure and comments.

4. A management system for semiconductor manufacturing data of claim 3, wherein semiconductor defect size and location is tracked.

5. A management system for semiconductor manufacturing data of claim 1, wherein at least one of the plurality of remote devices is capable of receiving electronic notification in the event of failure.

6. A management system for semiconductor manufacturing data of claim 1, wherein the management system is capable of correlating at least one of a kill ratio, a yield impact and a yield loss.

7. A management system for semiconductor manufacturing data of claim 1, wherein one of the at least one semiconductor characteristic is correlated to one of the at least one manufacturing condition.

8. A method for tracking semiconductor manufacturing defects, comprising;

determining semiconductor defects during manufacturing; p1 detecting at least one manufacturing condition associated with the semiconductor defect;

accessing a database of manufacturing data including semiconductor defect and at least one manufacturing condition in the invent of a semiconductor failure determination;

correlating semiconductor failure to determined semiconductor defect and the at least one manufacturing condition; and providing manufacturing data including semiconductor defect and at least one manufacturing condition to a website over a network, further including the step of electronically notifying a remote user of correlated wafer failure and manufacturing data, wherein electronically notification is one of transmitting an electronic mail message and instant messaging.

9. The method for tracking semiconductor manufacturing defects of claim 8, wherein correlating includes determining at least one of a kill ratio, a yield impact and a yield loss.

* * * * *